United States Patent [19]

Whitley et al.

[11] Patent Number: 4,464,829
[45] Date of Patent: Aug. 14, 1984

[54] COMPONENT LEAD BENDING APPARATUS

[75] Inventors: George J. Whitley, Philadelphia, Pa.; Martin Rayl, Lawrenceville, N.J.

[73] Assignee: RCA Corporation, New York, N.Y.

[21] Appl. No.: 469,737

[22] Filed: Feb. 25, 1983

[51] Int. Cl.³ .............................................. B23P 21/00
[52] U.S. Cl. ........................................ 29/741; 29/838; 29/739; 140/105
[58] Field of Search ................. 29/741, 839, 739, 845, 29/566.3, 838; 140/105, 93 D; 72/387, 452

[56] References Cited

U.S. PATENT DOCUMENTS

| | | | |
|---|---|---|---|
| 2,840,134 | 6/1958 | Rayburn et al. | 72/313 |
| 2,893,010 | 7/1959 | Stuhre | 29/34 R |
| 2,902,689 | 9/1959 | Petersen | 227/89 |
| 2,907,040 | 10/1959 | Woods | 29/741 |
| 3,333,857 | 8/1967 | Lindgren | 279/114 |
| 3,414,024 | 12/1968 | Anderson et al. | 29/741 |
| 4,138,785 | 2/1979 | Dearborn | 29/741 |
| 4,153,082 | 5/1979 | Foley | 140/105 |
| 4,165,557 | 9/1979 | Taguchi et al. | 29/566.3 |
| 4,218,817 | 8/1980 | Takano | 29/741 |
| 4,286,379 | 9/1981 | Kawa et al. | 29/741 |
| 4,377,026 | 3/1983 | Whitley | 29/838 |

FOREIGN PATENT DOCUMENTS 1350924 5/1971 United Kingdom ................. 29/741

Primary Examiner—Daniel C. Crane
Assistant Examiner—David B. Jones
Attorney, Agent, or Firm—Joseph S. Tripoli; George E. Haas; William Squire

[57] ABSTRACT

The leads of an IC module are bent to secure the module to a printed circuit board by a pair of rotatable bending members driven concurrently by a camming member which rotates about an axis normal to the axes of rotation of the bending members. Cam follower projections from the bending members engage spiral cam slots in the camming member. The slots spiral away from the axis of rotation of the camming member. All of the above structures are beneath the circuit board and above the lap of an operator who places the module on the board from above the board.

6 Claims, 8 Drawing Figures

COMPONENT LEAD BENDING APPARATUS

This invention relates to apparatus for bending the leads of a component on a printed circuit board, and more particularly to apparatus for bending the leads of integrated circuit components.

Apparatus exists for bending the leads of a component including integrated circuit components on a printed circuit board. Component leads are bent to lie generally parallel to the printed circuit board to prevent the component from falling out of the board until such time as the leads are permanently secured to the board by soldering in a subsequent manufacturing step. Such apparatus is shown and described in U.S. Pat. Nos. 2,893,010 and 4,153,082; and British Pat. No. 1,350,924. U.S. Pat. No. 2,840,134 discloses a module mounting device having cam actuated, pivotally mounted tab bending arms. Disclosed is apparatus for mechanically mounting electronic modules and electrically connecting the same to a printed circuit board. The disclosed apparatus, however, illustrates the module inserted with its leads facing upwards and the tab bending apparatus being positioned above the printed circuit board and module. This arrangement is not entirely satisfactory in a production line in which the modules are inserted from above by an operator sitting with his lap underneath the conveyor and the printed circuit board. Present conveyor systems in which components are inserted from above with an operator lap positioned underneath the conveyor leaves little room for such an apparatus between the printed circuit board and lap. Other systems as disclosed in the above-mentioned patents tend to either be cumbersome or not readily adapted for bending the multiple leads of integrated circuit modules.

In accordance with one embodiment of the present invention, apparatus for bending the leads of a component projecting from a printed circuit board includes a support structure and a component lead processing assembly for bending the leads of a component. Means are secured to the support structure for aligning a printed circuit board relative to the processing assembly. The assembly comprises a lead bending member rotatable about a first axis and includes cam follower means. Cam means are rotatable about a second axis normal to the first axis, the cam means having a cam slot which extends non-radially away from the second axis. The cam follower means is located in the cam slot and is responsive to the rotation of the slot about the second axis for rotating the bending member about the first axis. Drive means are coupled to the cam means for rotating the cam means about the second axis.

Figure 1:
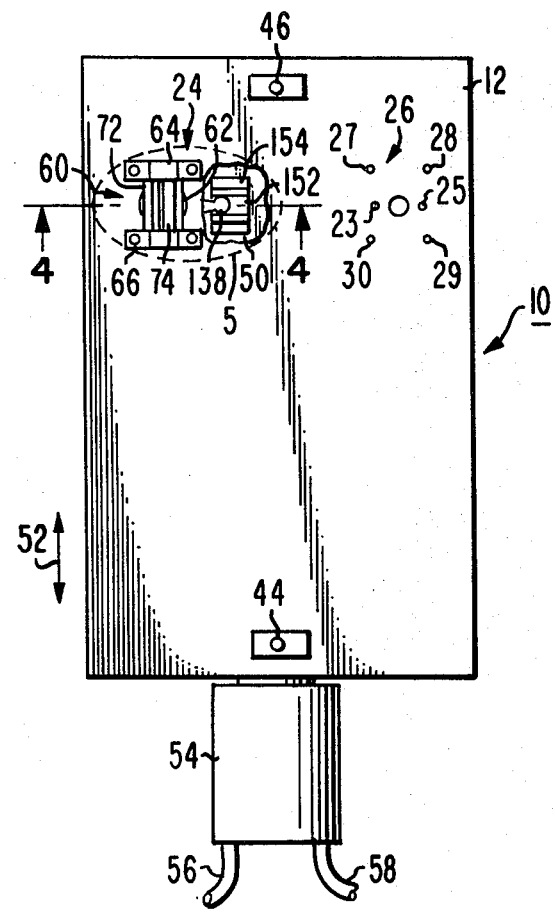
FIGS. 1 and 2 are plan and elevation views, respectively, of an integrated circuit module lead bending apparatus in accordance with one embodiment of the invention.
Figure 2:
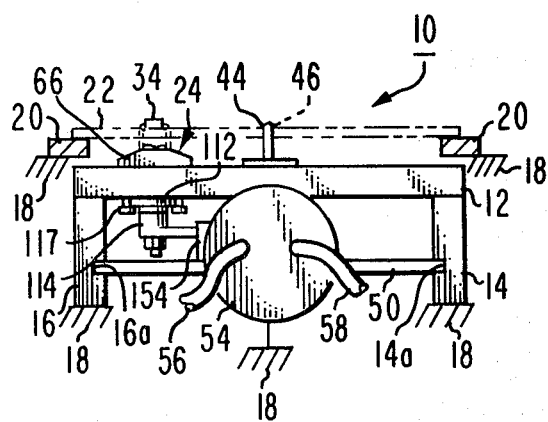

In FIGS. 1 and 2 an integrated circuit module lead bending apparatus 10 includes a support structure comprising a plate 12 and two frame and guide members 14 and 16 to which the plate 12 is secured. Plate 12 is shown partially broken away in FIG. 1 to illustrate details to be described below. As represented by the symbols 18, FIG. 2, frame members 14 and 16 are secured to stationary structural members (not shown) such as conveyor belt supporting structure in a factory assembly line. Conveyor belt 20 which may comprise two conveyor chains or similar conveying means which convey a printed circuit board 22 (shown in phantom in FIG. 2) is also supported by the structure represented by symbols 18. At least one, but typically a plurality of component bending assemblies 24, to be described in more detail below, are secured to plate 12. One such bending assembly is illustrated in FIG. 1.

In region 26 of plate 12 (FIG. 1) are apertures in the plate for accepting a second bending assembly. Apertures 23, 25, 27, 28, 29, and 30 are threaded to accept screws to secure a bending assembly 24 in place. Aperture 32 receives a portion of bending assembly 24. Apertures similar to apertures 23, 25, 27-30 and 32 are located in plate 12 for each bending assembly 24. The bending assemblies 24 are positioned on plate 12 at locations determined by the location on a printed circuit board 22 (FIG. 2) of components such as an integrated circuit module 34 (shown in phantom) whose leads are to be bent to secure the component to the printed circuit board.

Figure 6:
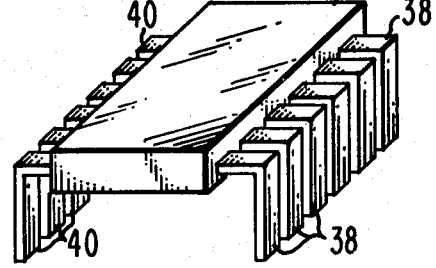
FIG. 6 is an isometric view of an integrated circuit module whose leads previously bent as shown are to be bent by the apparatus of FIGS. 4 and 5.

For example, in FIG. 6, integrated circuit module 34 (or other electrical component to be secured to the printed circuit board 22) comprises a body 36 and two parallel arrays of leads 38 and 40 protruding from the body 36 and which are provided bent as shown in FIG. 6 and to be further bent by the bending assembly 24 to be described below. The leads 38, 40 protrude through corresponding apertures in the printed circuit board 22 as shown in FIGg. 4. Thus, portions of the leads 38 and 40 protruding below the under surface 42 of printed circuit board 22 are to be folded over and bent against the board surface 42. The purpose of bending the leads is to secure the module 34 to the printed circuit board prior to the application of solder which mechanically and electrically connects the leads to corresponding conductors on the printed circuit board. Printed circuit board 22, FIG. 2, is positioned relative to plate 12 by locating pins 44, 46 (FIG. 1) which are secured to plate 12. The printed circuit board 22 has matching locating apertures which align the component or module 34 on the board to the bending assembly 24.

Movable plate 50, FIG. 2, slides in frames 14 and 16, guide slots 14a and 16a, respectively, parallel to and spaced from plate 12. Motion of plate 50 is in directions 52, FIG. 1, parallel to the plane of plates 12 and 50. In FIGS. 1 and 2 air cylinder 54, which is mechanically secured to the structure to which frames 14 and 16 are secured, moves plate 50 in directions 52. Air cylinder 54 is air operated in one direction of directions 52 in response to pressurized air supplied in one or the other of hoses 56, 58, FIGS. 1 and 2. The purpose of plate 50 is to impart simultaneous rotary motion to the bending parts of the bending assembly 24 as will be described next.

Figure 4:
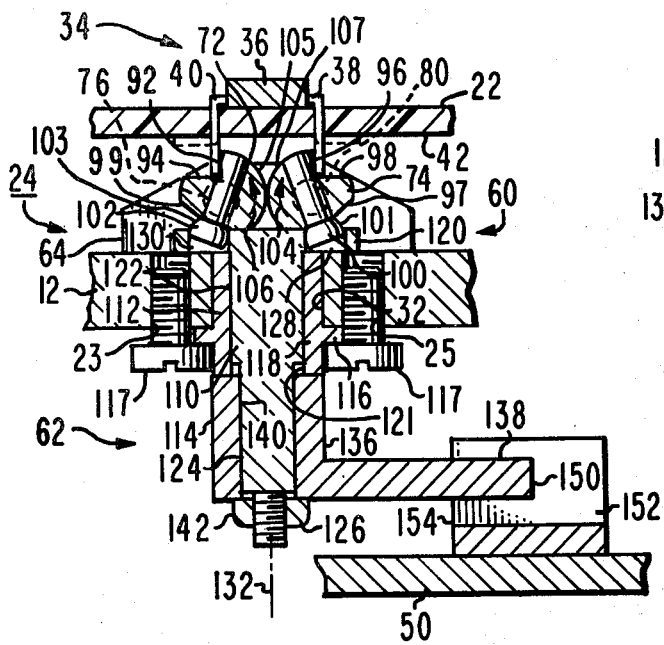
FIG. 4 is a sectional view taken along lines 4—4 of FIG. 1 illustrating one embodiment of a lead bending assembly for bending the leads of an integrated circuit module mounted on a printed circuit board.
Figure 5:
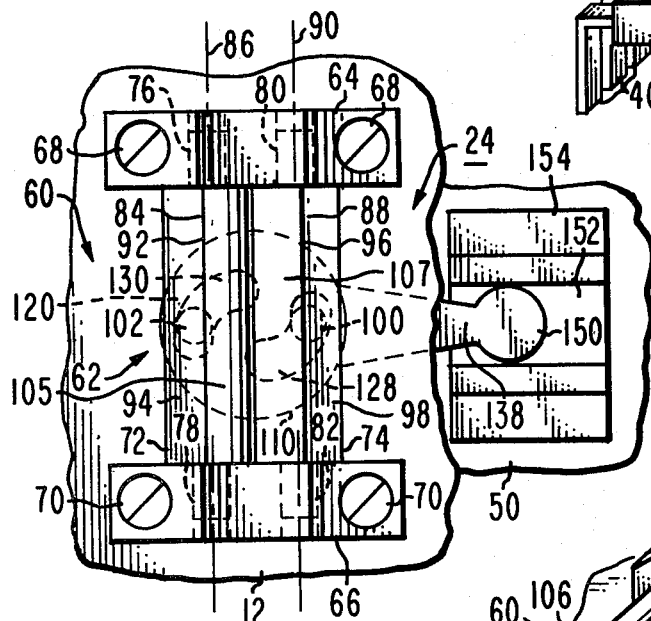
FIG. 5 is a more detailed plan view of area 5 in circled dashed line FIG. 1 illustrating the elements of the lead bending apparatus employed in the apparatus of FIG. 1.
Figure 7:
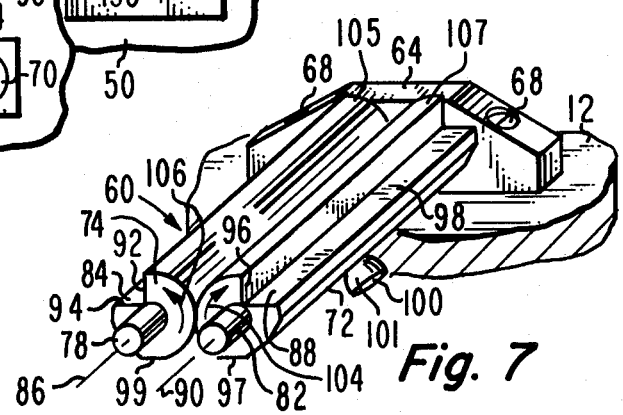
FIG. 7 is an isometric view of the lead bending portions of the apparatus of FIG. 5.

In FIGS. 4 and 5 the bending assembly 24 comprises a bending head assembly 60 and a camming assembly 62. In FIGS. 4, 5, and 7 the bending head assembly 60 comprises a pair of end supports 64 and 66. In FIG. 5 the support 64 is secured to plate 12 by a pair of screws 68 which are threaded to apertures such as apertures 27 and 28, FIG. 1. The support 66 is secured to plate 12 by a pair of screws 70 which are threaded to apertures such as apertures 29 and 30, FIG. 1. Rotatably mounted to the supports 64 and 66 are a pair of like bending members 72 and 74 which are mounted in mirror image fashion.

In FIG. 5 the bending member 72 includes at opposite ends axially aligned journals 76 and 78. Journal 76 is in a journal bearing in support 64 and journal 78 is in a journal bearing in support 66. Bending member 74 has a pair of axially aligned journals 80 and 82 which are journaled, respectively, in corresponding bearings in supports 64 and 66. The journals 80 and 82 are aligned along an axis of rotation parallel to the axis of rotation of journals 76, 78 of member 72.

Bending members 72 and 74 may be right semicircular cylinders or semicircular rods. Bending member 72 may be formed from a right circular cylinder by removing material in a right angle sector 84, FIG. 7, along the length of member 72 parallel to the axis of rotation 86 about which the member 72 rotates. Similarly, bending member 74 may be formed from a right circular cylinder by removing a like right angle sector 88 from the member 74 along the length of member 74 parallel to the axis 90 about which the member 74 rotates. The removal of sector 84 leaves member 72 with two end walls 92 and 94 which meet at right angles and extend the length of member 72. The removal of sector 88 of member 74 leaves two end walls 96 and 98 which meet at right angles and extend the length of member 72. Walls 92 and 96 forming the bending portions are parallel, and walls 94 and 98 are parallel in the initial position of members 72, 74. Walls 94 and 98 may also be coplanar. The walls 92 and 96 may lie on respective planes which pass through the axes of rotation of the corresponding bending member. The spacing between walls 92 and 96 is slightly less than the spacing between leads 38 and 40 of module 34, FIG. 4. Walls 94 and 98 are spaced from the respective axes 86, 90.

In FIG. 4 a cam follower projection 100 is pinned to member 74 and projects from the lower peripheral surface 97 of bending member 74. A like cam follower projection 102 is pinned to member 72 and projects from the lower peripheral surface 99 of bending member 72. Lower surfaces 97 and 99 are flattened somewhat relative to outer circular surfaces 105, 107 to further reduce the spacing of assembly 60 from the top of the drawing to the bottom of the drawing. The projections 100 and 102 may be of like dimensions and positioned centrally along the length dimension of the corresponding bending members 74, 72. The exterior surfaces 101, 103 of the respective projections are spherical having a flattened end as shown. In the initial position prior to bending the leads 38, 40, FIG. 4, the projections may be oriented at an angle, e.g., 70°, with respect to plate 12. Wall 96 has a length dimension in and out of the drawing of FIG. 4 sufficient in size so that it is adjacent all of the leads 38 of the module 34. Wall 92 is similarly adjacent the leads 40 of the module 34.

Figure 3:
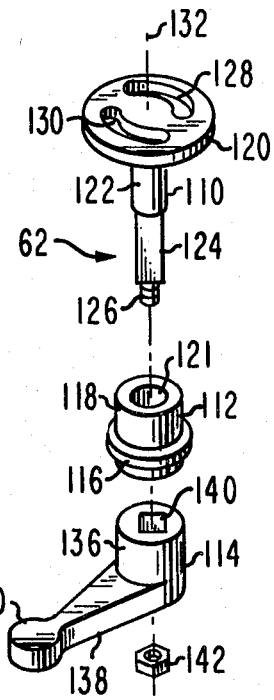
FIG. 3 is an isometric view of a portion of the apparatus of FIG. 1.

The camming assembly 62, FIG. 4, rotates the bending members 72 and 74 in the directions 106 and 104 about axes 90, 86 (FIG. 7), respectively, by means of the respective cam follower projections 102, 100. In FIGS. 3 and 4, camming assembly 62 comprises a rotary cam 110, a bushing 112, and a drive 114. Bushing 112 includes a flange 116 and a shank 118 and a journal bearing 121. Shank 118 is received in aperture 32 in plate 12, FIG. 4. Flange 116 abuts against the lower surface of plate 12 and is secured to plate 12 by screws 117 threaded in holes 23, 25. Portions of bushing 112 are removed to receive the head of screws 117.

Figure 8:
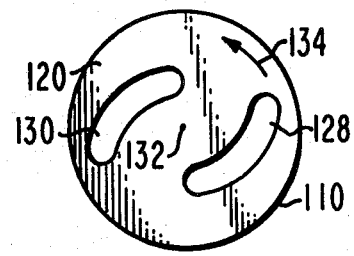
FIG. 8 is a plan view of a cam drive head employed in the apparatus of FIGS. 4 and 5.

Cam 110 includes a camming disc 120, journal 122, drive shank 124 which is square in section, and a threaded stud 126. Journal 122 is closely received in the journal bearing 121 of bushing 112, FIG. 4. The camming disc 120 is circular having two spiral slots 128 and 130, each of which spirals away from the axis 132 of rotation of the cam 110. In FIG. 8 the spiral slot 128 is diametrically opposite the spiral slot 130 and each spiral away from the axis 132 in the same angular direction 134. In the alternative, the slots 128 and 130 may be replaced with straight slots which extend away from axis 132 in a non-radial direction. The slots 128 and 130 are equidistant from the axis 132. Slot 128 receives projection 100 from the bending member 74 and slot 130 receives the projection 102 from the bending member 72, FIG. 4. In FIG. 4, nut 142 locks drive 114 against bushing 112, flange 116 and the camming disc 120 against the upper end of shank 118 of bushing 112.

The projection 100 of camming member 74, FIG. 4, is always located within slot 128 regardless the angular position of the disc 120 as the disc 120 is rotated in direction 134, FIG. 8, about axis 132. Similarly, the projection 102 of bending member 72 is always within the slot 130, FIG. 8, regardless the angular position of the camming disc 120 in direction 134. The spirals of slots 128 and 130 as they rotate in the direction 134 displace the respective projections 100 and 102 in a radial direction toward the axis 132, FIG. 8. This radial displacement of the projections 100 and 102, however, also causes the angular rotation of the respective bending members 74 and 72 in directions 104 and 106, FIG. 4, about their respective axes of rotation 90 and 86, FIG. 7. The rotation of member 74 in direction 104 by projection 100, FIG. 4, bends the ends of leads 38 as shown in phantom and rotation of the bending member 72 in direction 106 by projection 102 bends the leads of array 40 also as shown in phantom. This securely fastens the module 34 to the printed circuit board 22, FIG. 4.

Lever 138 of drive 114, FIG. 3, includes a curved end 150 which lies within slot 152 of slotted bracket 154, FIGS. 4 and 5. Bracket 154 is secured to plate 50. Linear displacement of the plate 50 in directions 52, FIG. 1, rotates the lever 138 about axis 132, FIG. 4. This action rotates the camming disc 120 which, in turn, rotates the bending members 72 and 74.

In operation, a printed circuit board with at least one or typically a plurality of integrated circuit modules such as module 34, FIG. 2, is aligned to the apparatus 10, FIG. 1, by way of the locating pins 44, 46. This action aligns the leads 38, 40, FIGS. 4, 6, adjacent the bending walls 96 and 92, respectively, of the bending members 74, 72. The bending head assembly 60 may be oriented in any angular orientation as desired with respect to axis 132, FIG. 4, as determined by the orientation of module 34. Of course, apertures 23, 25, 27–30 are oriented accordingly, FIG. 1. What is important is that the relative spacing from plate 50, FIG. 4, to printed circuit board 22 can be in the order of a few inches so that the entire structure can fit over the lap of an operator but beneath the level of conveyor 20, FIG. 2.

Applying pressure to one of the hoses 56, 58 actuates the air cylinder 54, displacing the plate 50 relative to the plate 12 in the appropriate one of directions 52. This causes rotation of the lever 138 of drive 114, FIG. 4, rotating the camming disc 120 and the bending members 72, 74. This action bends the leads of arrays 38 and 40, regardless their angular orientation about axis 132, FIG. 4, securing the module 34 to the printed circuit board 22.

While the drive 114 and slotted bracket 154 may be used in one implementation for rotatably driving the camming assembly 62, it will be equally apparent that other drive means may be employed. Such other drive means can be rack and pinions, gears, and similar apparatus.

The bending members 72 and 74, can be relatively small and can have a length dimension approximately slightly greater than the length dimension of the corresponding leads 38, 40 of the module 34, FIG. 6. Many of these bending assemblies can be placed one adjacent to the other in an array in a plane to concurrently bend the leads of a plurality of modules to be attached to a single printed circuit board. The leads of the different modules may have different orientations with respect to directions 52, FIG. 1. By providing the plate 12 with a plurality of corresponding aperture arrays such as the apertures in region 26, FIG. 1, many different lead bending assemblies can be attached to the plates 12 and 50. The single drive motion of air cylinder 54 concurrently activates all of the bending members regardless their orientation relative to directions 52 to quickly and simply secure the different modules to a printed circuit board. Upon completion of the lead bending process, the circuit board may be conveyed to a further work station and a new printed circuit board assembly aligned to the apparatus 10 of FIG. 1. The apparatus of the present invention as shown in FIG. 4 can occupy a vertical space, for example, in a direction from the bottom of the drawing to the top of the drawing of relatively small size, for example, of a few inches to permit an operator to sit beneath the conveyor belts 20, FIG. 2, and the operator to manually insert the modules 34 onto the printed circuit board prior to the bending process.

What is claimed is:

1. Apparatus for bending the leads of a component projecting from a printed circuit board comprising:
   a support structure;
   a component lead processing assembly including a lead bending member for bending the leads of a component projecting from the printed circuit board;
   means secured to the support structure for aligning a printed circuit board relative to said processing assembly;
   said assembly comprising a lead bending member rotatable about a first axis and rotatable into said projecting leads and including cam follower means, cam means rotatable about a second axis normal to said first axis, said cam means having a cam slot that extends outward non-radially from said second axis, said cam follower means being located in said cam slot and responsive to the rotation of said slot about said second axis for rotating said bending member about said first axis; and
   drive means coupled to said cam means for rotating said cam means about said second axis.

2. The apparatus of claim 1 wherein said bending member comprises a rod having a length dimension parallel to said first axis, said rod having a lead bending portion parallel to said length dimension, said rod including bearing means for rotatably supporting the rod for rotation about said first axis, said cam follower means including a projection extending from said rod normal to said first axis and adapted to remain in contact with during and responsive to the rotation of said slot about said second axis.

3. The apparatus of claim 2 wherein said rod bending portion comprises a side wall lying in a plane parallel to said second axis in an initial position and in a plane intersecting said second axis in a lead bending position.

4. The apparatus of claim 1 wherein said assembly comprises a pair of lead bending members rotatable about respective first axes, each member including cam follower means, said cam means rotatable about said second axis normal to said first axes, said cam means including a pair of camming slots, each spiraling away from said second axis, one cam follower in one slot and a second follower in the other slot and responsive to the rotation of said slots about said second axis for concurrently rotating said bending members about said respective first axes.

5. The apparatus of claim 4 wherein said drive means includes lever means attached to said cam means and means coupled to said lever means for rotating the lever means about said second axis.

6. A component lead bending system comprising:
   a support structure;
   a lead bending assembly;
   means secured to the structure for aligning leads to the assembly to be bent by said assembly;
   said bending assembly comprising a cam member rotatably secured to said structure for rotation about a first axis, a pair of spiral slots in said cam member spiraling away from said axis, first and second bending members each having a lead bending surface and rotatable about second and third respective axes normal to said first axis, said bending surfaces extending parallel to said second and third axes, a cam follower extending from each member and positioned in a different slot, each cam follower responsive to the rotation of its corresponding slot about said first axis for rotating the corresponding bending member about its axis; and
   drive means for selectively reciprocally rotating said cam member about said first axis.

* * * * *